(12) United States Patent
Ko et al.

(10) Patent No.: US 12,237,022 B2
(45) Date of Patent: Feb. 25, 2025

(54) SEMICONDUCTOR DEVICE FOR IMPROVING RETENTION PERFORMANCE AND OPERATING METHOD THEREOF

(71) Applicant: SAMSUNG ELECTRONICS CO., LTD., Suwon-si (KR)

(72) Inventors: Sanggyu Ko, Suwon-si (KR); Yeongmin Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 17/983,705

(22) Filed: Nov. 9, 2022

(65) Prior Publication Data
US 2023/0154551 A1    May 18, 2023

(30) Foreign Application Priority Data

Nov. 12, 2021 (KR) .......... 10-2021-0156075
Jul. 4, 2022  (KR) .......... 10-2022-0082135

(51) Int. Cl.
G11C 16/34 (2006.01)
G11C 16/08 (2006.01)
G11C 16/16 (2006.01)

(52) U.S. Cl.
CPC .......... G11C 16/3445 (2013.01); G11C 16/08 (2013.01); G11C 16/16 (2013.01); G11C 16/3404 (2013.01)

(58) Field of Classification Search
CPC ..... G11C 16/3445; G11C 16/08; G11C 16/16; G11C 16/3404; G11C 16/10; G11C 11/5635; G11C 16/0483; G11C 16/344; G11C 16/3459
See application file for complete search history.

(56) References Cited

U.S. PATENT DOCUMENTS

| | | | |
|---|---|---|---|
| 5,568,419 A | 10/1996 | Atsumi et al. | |
| 5,657,272 A | 8/1997 | Sato | |
| 5,844,847 A | 12/1998 | Kobatake | |
| 6,288,946 B1 | 9/2001 | Hong et al. | |
| 6,381,670 B1 | 4/2002 | Lee et al. | |
| 6,452,837 B2 | 9/2002 | Mori et al. | |
| 7,929,351 B2 | 4/2011 | Seol et al. | |
| 10,032,518 B2* | 7/2018 | Lee | G11C 16/349 |
| 10,553,294 B2 | 2/2020 | Dunga et al. | |
| 2012/0269001 A1* | 10/2012 | Ueno | G11C 16/16 365/185.22 |
| 2014/0269090 A1* | 9/2014 | Flynn | G11C 16/14 365/185.24 |
| 2020/0381067 A1 | 12/2020 | Maeda | |
| 2020/0381074 A1* | 12/2020 | Wang | G11C 29/789 |

FOREIGN PATENT DOCUMENTS

KR   10-0335779 B1   5/2002
KR   10-0465066 B1   1/2005

* cited by examiner

*Primary Examiner* — Douglas King
(74) *Attorney, Agent, or Firm* — Muir Patent Law, PLLC

(57) ABSTRACT

A semiconductor device includes a memory device and a controller configured to perform an erase operation on the memory device, perform a correction operation for a threshold voltage of a deep-erased cell, and perform an erase verify operation by identifying whether threshold voltages of a plurality of cells of the memory device fall within a predefined range.

17 Claims, 14 Drawing Sheets

SEMICONDUCTOR DEVICE FOR IMPROVING RETENTION PERFORMANCE AND OPERATING METHOD THEREOF

CROSS-REFERENCE TO RELATED APPLICATIONS

This application is based on and claims priority under 35 U.S.C. § 119 to Korean Patent Application No. 10-2021-0156075, filed on Nov. 12, 2021, and No. 10-2022-0082135, filed on Jul. 4, 2022, in the Korean Intellectual Property Office, the disclosures of which are incorporated by reference herein in their entirety.

BACKGROUND

1. Field

Embodiments relate to a semiconductor device for improving retention performance and an operating method thereof.

2. Description of the Related Art

With the development of Industry 4.0, there is an increasing demand for non-volatile memory devices capable of storing more data in order to respond to new information technology (IT) environments, such as expansion of cloud services, Internet of things (IoT), and artificial intelligence (AI). Accordingly, non-volatile memory devices have been continuously scaled down to increase the density of integration.

With the recent development of NAND flash memory devices in which a channel is vertically formed beyond the limits of a two-dimensional (2D) structure, the integration density of NAND flash memory devices has been increased.

SUMMARY

An embodiment is directed to a non-volatile memory device including a memory including a plurality of blocks, and a controller configured to perform an erase operation on at least one of the blocks of the memory, perform a correction operation on a threshold voltage of a deep-erased cell among a plurality of cells of the at least one block, and perform an erase verify operation by identifying whether threshold voltages of the plurality of cells fall within a predefined range.

An embodiment is directed to a semiconductor device including a memory device and a controller configured to perform a correction operation on a threshold voltage of a deep-erased cell as an operation previous to a program operation, perform the program operation on a plurality of cells of the memory device that has undergone the correction operation, and perform a program verify operation by identifying whether threshold voltages of the plurality of cells of the memory device fall within a predefined range.

An embodiment is directed to an operating method of a semiconductor device including a memory device. The operating method includes performing an erase operation on the memory device, identifying a performance degradation indicator of the memory device, and performing a correction operation on a threshold voltage of a deep-erased cell when the performance degradation indicator is greater than or equal to a threshold value.

BRIEF DESCRIPTION OF THE DRAWINGS

Features will become apparent to those of skill in the art by describing in detail example embodiments with reference to the attached drawings in which.

DETAILED DESCRIPTION

Figure 1:
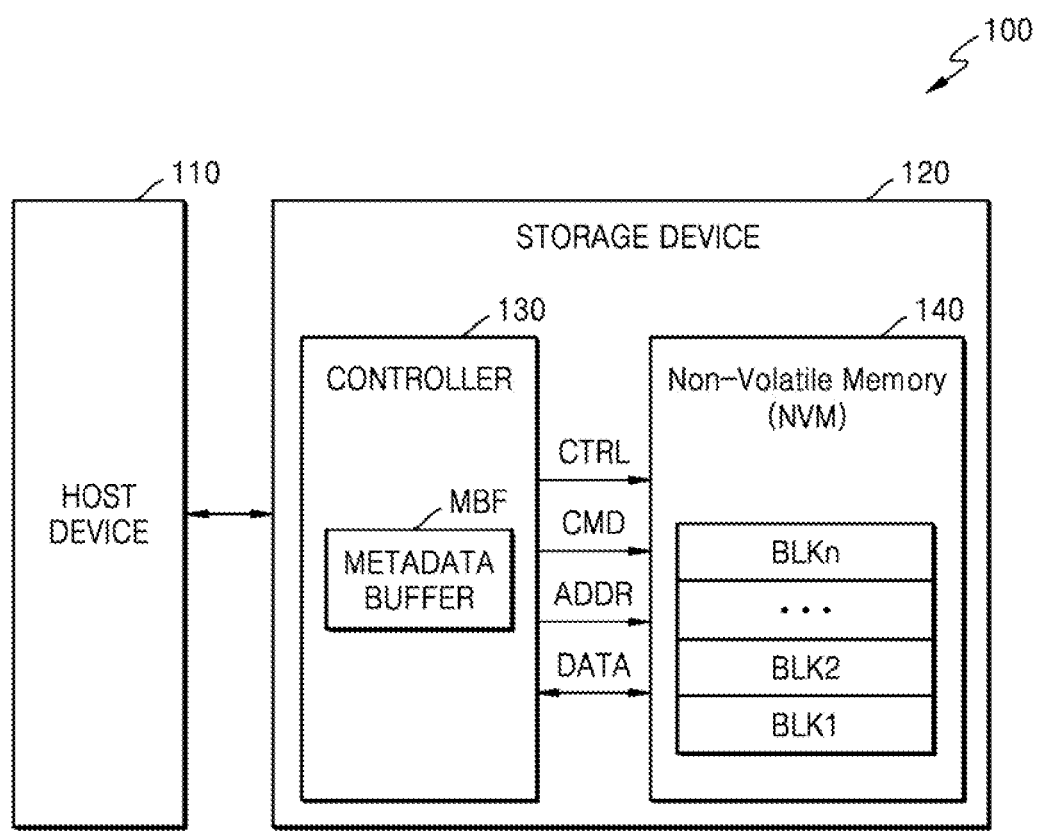
FIG. 1 is a block diagram of a memory system according to an example embodiment.

FIG. 1 is a block diagram for conceptually describing a memory system according to an example embodiment.

Referring to FIG. 1, a memory system 100 may include a host device 110 and a storage device 120.

In an example embodiment, the memory system 100 may correspond to a data center constituted of several tens of host machines or servers, which run several hundreds of virtual machines. The memory system 100 may include a computing device, such as a laptop computer, a desktop computer, a server computer, a workstation, a handheld communication terminal, a personal digital assistant (PDA), a portable multimedia player (PMP), a smartphone, or a tablet personal computer (PC), a virtual machine, or a virtual computing device thereof.

In an example embodiment, the memory system 100 may correspond to a part of an element, such as a graphics card, of a computing system.

The memory system 100 may have other configurations.

The host device 110 may refer to a data processing device capable of processing data. The host device 110 may execute an operating system (OS) and/or various applications. The host device 110 may include a central processing unit (CPU), a graphics processing unit (GPU), a neural processing unit (NPU), or a digital signal processor (DSP), a microprocessor, an application processor (AP), or the like. In an example embodiment, the memory system 100 may be included in a mobile device, and the host device 110 may be implemented as an AP. In an example embodiment, the host device 110 may be implemented as a system-on-chip (SoC) and thus embedded in the memory system 100. The host device 110 may include at least one processor. The host device 110 may include a multi-core processor.

The host device 110 may be configured to execute commands, which are executable with one or more machines, software, firmware, or pieces of a combination thereof. The host device 110 may control data processing operations on the storage device 120. For example, the host device 110 may control a data read operation, a program operation, an erase operation, and a correction operation of the storage device 120. The correction operation may be performed on a deep-erased cell.

The host device 110 may communicate with the storage device 120 using various protocols. For example, the host device 110 may communicate with the storage device 120 using an interface protocol, such as peripheral component interconnect express (PCI-E), advanced technology attachment (ATA), serial ATA (SATA), parallel ATA (PATA), or serial attached small computer system interface (SCSI) (SAS). Besides the above, other various interface protocols, such as a universal flash storage (UFS) protocol, a multimedia card (MMC) protocol, an enhanced small disk interface (ESDI) protocol, and an integrated drive electronics (IDE) protocol, may be applied to the protocol between the host device 110 and the storage device 120.

The storage device 120 may include a controller 130 and a non-volatile memory (NVM) device 140.

The storage device 120 may correspond to an internal memory embedded in an electronic device. For example, the storage device 120 may include a solid-state drive or solid-state disk (SSD), a universal flash storage (UFS) memory card, a micro secure digital (SD) card, or an embedded MMC (eMMC).

The storage device 120 may correspond to an external memory removable from an electronic device. For example, the storage device 120 may include a UFS memory card, a compact flash (CF) card, an SD card, a microSD card, a miniSD card, an extreme digital (xD) card, or a memory stick.

The storage device 120 may be referred to as a "semiconductor device."

The controller 130 may generally control operations of the storage device 120. When power is supplied to the storage device 120, the controller 130 may execute firmware. When the NVM device 140 is a NAND flash memory device, the controller 130 may execute firmware, such as a flash translation layer (FTL), for controlling communication between the host device 110 and the storage device 120. The controller 130 may receive data and a logical block address from the host device 110 and link the logical block address to a physical block address. The physical block address may indicate an address of a memory cell, in which the data will be stored among the memory cells of the NVM device 140.

The controller 130 may process a request of the host device 110. The controller 130 may control the NVM device 140. At the request of the host device 110, the controller 130 may control the NVM device 140 to perform at least one selected from among a program operation, a read operation, an erase operation, and a correction operation for a deep-erased cell.

The controller 130 may control the NVM device 140 to perform an internal management operation or a background operation of the storage device 120, regardless of the request of the host device 110.

The controller 130 may be implemented using an SoC, an application specific integrated circuit (ASIC), a field programmable gate array (FPGA), or the like.

The controller 130 may include a metadata buffer MBF. The controller 130 may manage the metadata buffer MBF in certain memory group units. For example, the controller 130 may manage the metadata buffer MBF in memory block units.

Although there is one metadata buffer MBF in the embodiment of FIG. 1, embodiments are not limited thereto. Metadata may be classified and stored in a plurality of metadata buffers.

The metadata buffer MBF may include static random access memory (SRAM), dynamic RAM (DRAM), or tightly coupled memory (TCM).

Although it is illustrated in FIG. 1 that the metadata buffer MBF is included in the controller 130, the metadata buffer MBF may be implemented outside the controller 130.

The metadata buffer MBF may have a smaller capacity than the NVM device 140 but may have improved latency, access time, and operating speed relative to the NVM device 140.

The metadata buffer MBF may store various kinds of metadata. The metadata buffer MBF may include information or a program for controlling or managing the NVM device 140, a mapping table showing the relationship between a logical address of the host device 110 and a physical address of the NVM device 140, data to be stored in the NVM device 140, data output from the NVM device 140, information for managing the memory space of the NVM device 140, a program/erase (P/E) cycle of each memory block, an erase count, degradation information, a loop count, a number of degraded memory cells resulting from a one-shot program, and a ratio between on-cells and off-cells after application of the one-shot program. The erase count may be referred to as a "P/E count."

The controller 130 may control the NVM device 140 such that each of a plurality of memory blocks, e.g., first to n-th memory blocks BLK1 to BLKn, performs a correction operation on the threshold voltage of a deep-erased cell.

For example, the controller 130 may manage (e.g., store and update) metadata (e.g., an erase count or degradation information), which is related to the degradation management of the NVM device 140, in memory block units. The degradation may refer to changes in the physical properties of memory cells when the P/E cycle increases. With the degradation of a memory cell, endurance and retention features may be degraded.

The NVM device 140 may perform a program operation, a read operation, an erase operation, and a correction operation for a deep-erased cell under control by the controller 130.

Although it is illustrated in FIG. 1 that the storage device 120 includes one NVM device 140, the storage device 120 may include a plurality of NVM devices.

The NVM device 140 may include NAND flash memory.

The NVM device 140 may include the first to n-th memory blocks BLK1 to BLKn.

Each of the first to n-th memory blocks BLK1 to BLKn may include a memory cell array, in which a plurality of memory cells are arranged in a two-dimensional (2D) or three-dimensional (3D) structure. The memory cells may include NAND flash memory cell but are not limited thereto. The memory cells may include resistive-type memory cells, such as resistive RAM (RRAM) cells, phase-change RAM (PRAM) cells, or magnetic RAM (MRAM) cells.

Each of the first to n-th memory blocks BLK1 to BLKn may be a unit of an erase operation and a correction operation for a deep-erased cell.

The NVM device 140 may receive a write command CMD, an address ADDR, a control signal CTRL, and data DATA from the controller 130, and may write the data DATA to memory cells corresponding to the address ADDR.

The NVM device 140 may receive a read command CMD and an address ADDR from the controller 130 and output data DATA, which is read from memory cells corresponding to the address ADDR, to the controller 130.

The NVM device 140 may receive an erase command CMD and an address ADDR from the controller 130 and erase data from memory cells corresponding to the address ADDR.

The NVM device 140 may receive a correction command CMD and an address ADDR from the controller 130 and perform a correction operation on the threshold voltage of memory cells corresponding to the address ADDR.

Although not shown, the controller 130 may further include an error correction code (ECC) unit. The ECC unit may detect and correct an error in data received from the host device 110 or the NVM device 140, thereby providing correct data.

The NVM device 140 is described in detail below with reference to FIG. 2.

Figure 2:
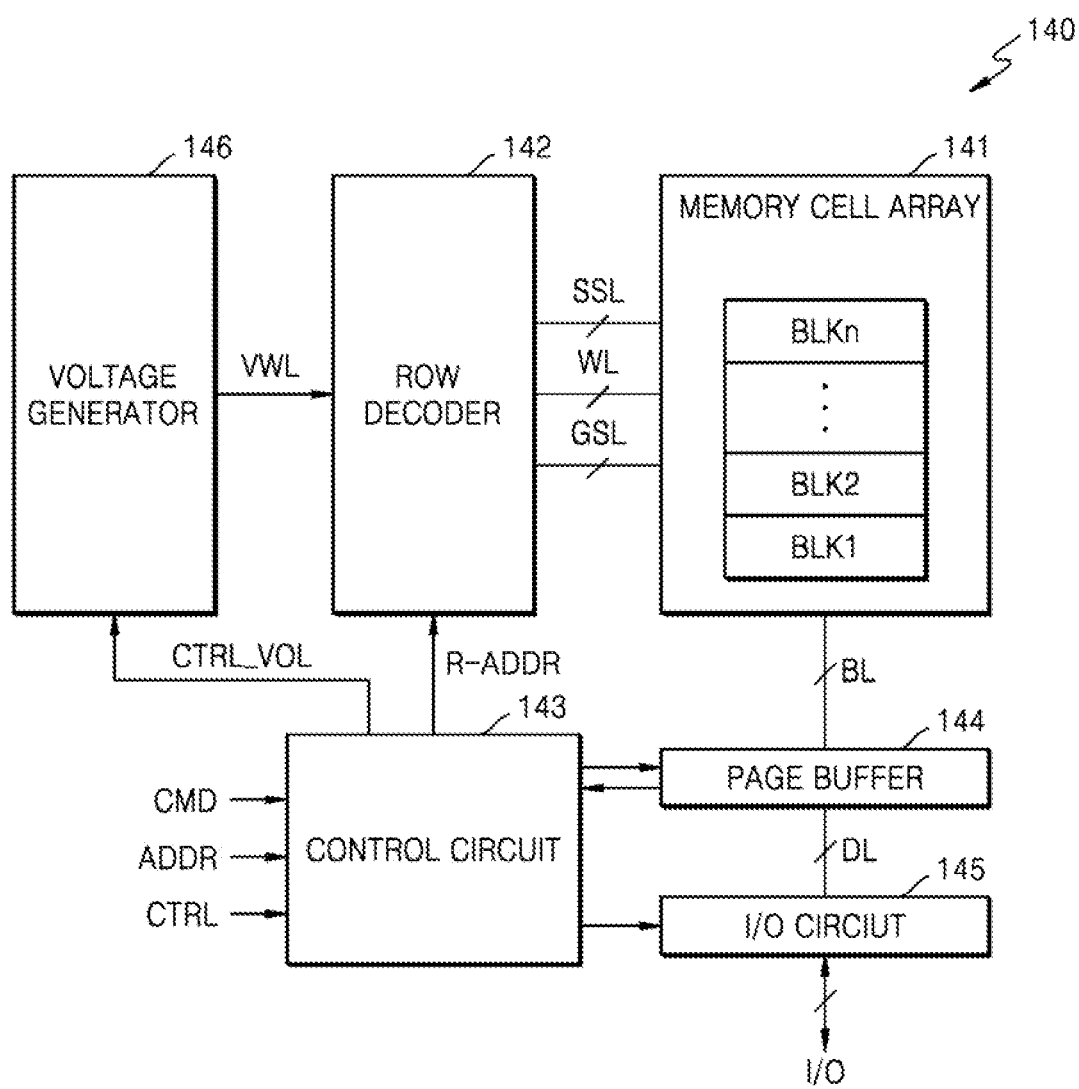
FIG. 2 is a block diagram of a non-volatile memory device according to an example embodiment.

FIG. 2 is a block diagram of an NVM device according to an example embodiment. In detail, FIG. 2 is a block diagram illustrating the NVM device 140 in FIG. 1.

Referring to FIG. 2, the NVM device 140 may include a memory cell array 141, a row decoder 142, a control circuit 143, a page buffer 144, an input/output (I/O) circuit 145, and a voltage generator 146.

Although not shown, the NVM device 140 may further include an I/O interface.

The memory cell array 141 may be connected to word lines WL, string select lines SSL, ground select lines GSL, and bit lines BL. The memory cell array 141 may be connected to the row decoder 142 through the word lines WL, the string select lines SSL, and the ground select lines GSL and connected to the page buffer 144 through the bit lines BL.

The memory cell array 141 may include a 3D memory cell array. The 3D memory cell array may be monolithically formed in an active region on a silicon substrate and at at least one physical level of arrays of memory cells, which have a circuit, which is involved in the operation of the memory cells and formed on or in the silicon substrate. The term "monolithic" may mean that layers of each level of an array are directly stacked on layers of an underlying level of the array. The 3D memory cell array may include NAND strings, which are arranged in a vertical direction so that at least one memory cell is placed on another memory cell. The memory cell may include a charge trap layer. In some example embodiments, the memory cell array 141 may include a 2D memory cell array.

The memory cell array 141 may include the first to n-th memory blocks BLK1 to BLKn. Each of the first to n-th memory blocks BLK1 to BLKn may include a plurality of memory cells and a plurality of select transistors.

The memory cells may be connected to the word lines WL, and the select transistors may be connected to the string select lines SSL or the ground select lines GSL.

The memory cells may be NAND flash memory cells.

Each of the first to n-th memory blocks BLK1 to BLKn may have a 3D structure (or a vertical structure). In detail, each of the first to n-th memory blocks BLK1 to BLKn may include a plurality of NAND strings extending in a direction perpendicular to a substrate.

However, each of the first to n-th memory blocks BLK1 to BLKn may have a 2D structure.

Each of the memory cells of the memory cell array 141 may be a multi-level cell (MLC) that stores at least two bits of data, a triple-level cell (TLC) that stores three bits of data, or a quadruple-level cell (QLC) that stores four bits of data. Accordingly, the first to n-th memory blocks BLK1 to BLKn may include at least one selected from among an MLC block including MLCs, a TLC block including TLCs, and a QLC block including QLCs.

The memory cell array 141 is described in detail with reference to FIGS. 3 and 4 below.

When a program voltage is applied to the memory cell array 141, a plurality of memory cells may be in a programmed state.

When an erase voltage is applied to the memory cell array 141, a plurality of memory cells may be in an erased state.

When a correction voltage is applied to the memory cell array 141, deep-erased cells among a plurality of memory cells may be in a soft programmed state.

A memory cell may be in one of an erased state or programmed states according to the threshold voltage thereof. For example, when a memory cell is an MLC, the memory cell may be in one of an erased state and at least three programmed state.

The operation of the memory cell array 141 is described in detail with reference to FIGS. 9 to 11 below.

The row decoder 142 may select one of the first to n-th memory blocks BLK1 to BLKn of the memory cell array 141. The row decoder 142 may select one of the word lines WL of the selected memory block. In a program operation, the row decoder 142 may apply a program voltage and a verify voltage to a selected word line and apply a pass voltage to an unselected word line. The row decoder 142 may select some of the string select lines SSL or some of the ground select lines GSL in response to a row address R-ADDR.

The control circuit 143 may output various internal control signals for performing a program operation, a correction operation, and an erase operation on the memory cell array 141, based on the command CMD, the address ADDR, and the control signal CTRL from the controller 130 (in FIG. 1). The control circuit 143 may provide the row address R-ADDR to the row decoder 142, a column address to the I/O circuit 145, and a voltage control signal CTRL_VOL to the voltage generator 146.

The page buffer 144 may operate as a write driver or a sense amplifier according to an operation mode. In a read operation, the page buffer 144 may sense a bit line BL of a selected memory cell under control by the control circuit 143. Sense data may be stored in a latch included in the page buffer 144. The page buffer 144 may dump data from the latch to the I/O circuit 145 through a data line DL under control by the control circuit 143.

The I/O circuit 145 may temporarily store the command CMD, the address ADDR, and the data DATA, which are provided from outside the NVM device 140 through an I/O line I/O. The I/O circuit 145 may temporarily store read data of the NVM device 140 and output the read data to the outside through the I/O line I/O at a designated time point.

The voltage generator 146 may generate various voltages based on the voltage control signal CTRL_VOL transmitted from the control circuit 143, wherein the various voltages may be used by the memory cell array 141 to perform a program operation, a correction operation for a deep-erased cell, a read operation, and an erase operation. In detail, the voltage generator 146 may generate word line voltages VWL, such as a program voltage, a correction voltage, a read voltage, a pass voltage, an erase voltage, and an erase verify voltage.

Figure 3:
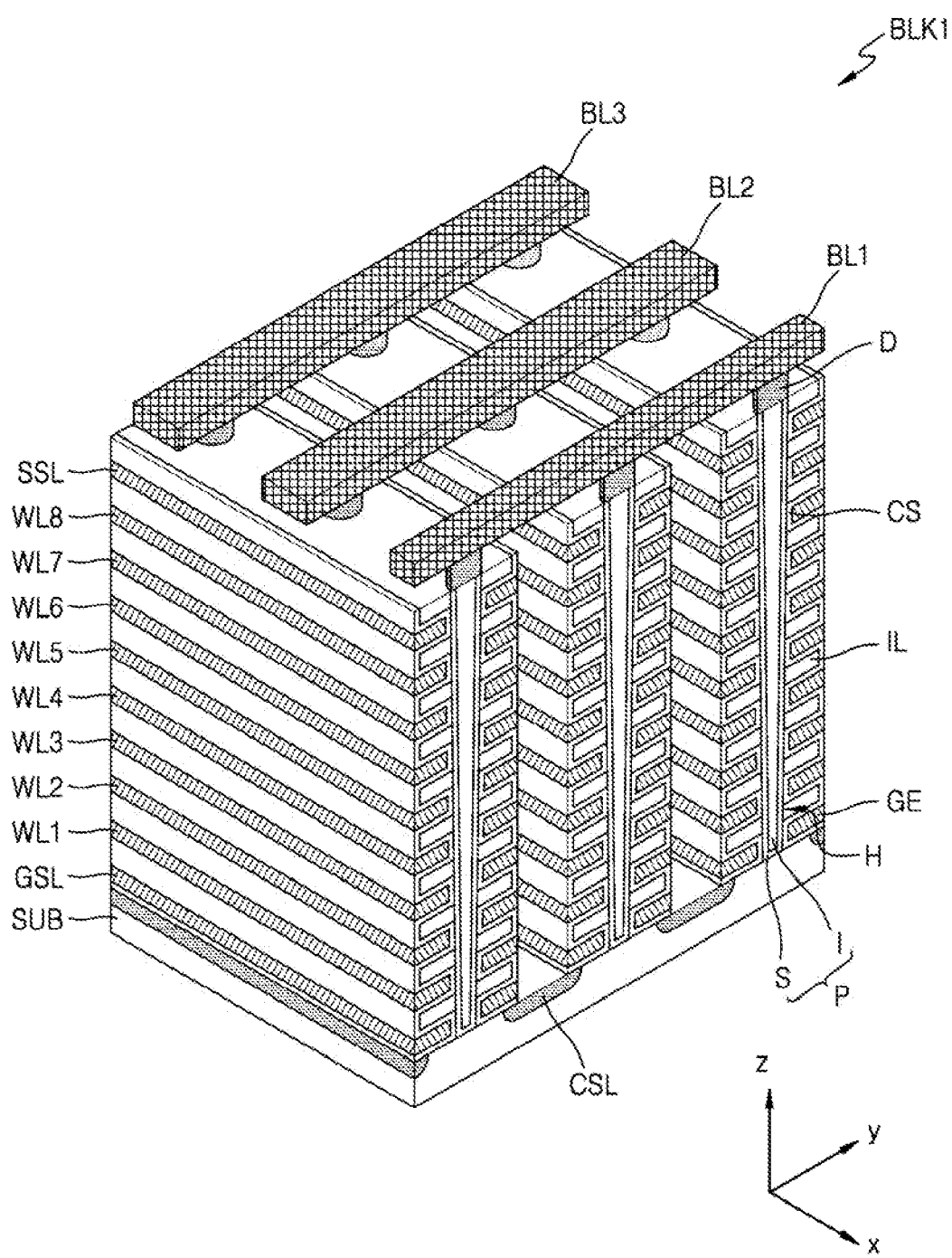
FIG. 3 is a perspective view of a memory block according to an example embodiment.

FIG. 3 is a perspective view of a memory block according to an example embodiment. FIG. 4 is a circuit diagram of an example of a memory block according to an example embodiment. In detail, FIGS. 3 and 4 are diagrams for describing the first memory block BLK1 among the first to n-th memory blocks BLK1 to BLKn in FIGS. 1 and 2.

Although the present embodiment is described based on the first memory block BLK1, the other memory blocks, i.e., the second to n-th memory blocks BLK2 to BLKn, may have the same structure as the first memory block BLK1.

FIGS. 1 and 2 are also referred to, in the description below.

Referring to FIG. 3, the first memory block BLK1 is formed in a direction perpendicular to a substrate SUB. The substrate SUB may have a first conductivity type (e.g., a p-type). A common source line CSL, which is doped with impurities of a second conductivity type (e.g., an n-type) and extends in a first direction "x", may be provided in the substrate SUB. The common source line CSL may function as a source region, which supplies current to memory cells.

In a region of the substrate SUB between two adjacent common source lines CSL, a plurality of insulating layers IL extend in a second direction "y" and are sequentially provided in a third direction "z". The insulating layers IL are separated from each other by a certain distance in the third direction "z". For example, the insulating layers IL may include an insulating material such as silicon oxide.

A channel hole H may be formed in the region of the substrate SUB between two adjacent common source lines CSL and filled with a surface layer S and an inner layer I. The surface layer S and the inner layer I, which fill the channel hole H, may have a pillar shape. Hereinafter, the surface layer S and the inner layer I, which fill the channel hole H, may be referred to as a pillar P. The channel holes H may be sequentially arranged in the first direction "x" and pass through the insulating layers IL in the third direction "z".

The surface layer S may be in contact with the substrate SUB. The surface layer S may function as a channel region. The surface layer S may include a silicon material of the first conductivity type (e.g., a p-type). For example, the surface layer S may include a silicon material of the same type as the substrate SUB.

The inner layer I may include an insulating material. For example, the inner layer I may include an insulating material, such as silicon oxide. For example, the inner layer I may include an air gap In the region between two adjacent common source lines CSL, a charge storage layer CS may be provided along the exposed surfaces of the insulating layers IL, pillars P, and the substrate SUB. The charge storage layer CS may have an oxide-nitride-oxide (ONO) structure.

A gate electrode GE may be on an exposed surface of the charge storage layer CS in the region between two adjacent common source lines CSL.

A drain contact D may be on a pillar P. The drain contact D may include a silicone material doped with impurities of the second conductivity type. For example, the drain contact D may include n-type silicon but is not limited thereto.

First to third bit lines BL1 to BL3 may be on the drain contact D. The first to third bit lines BL1 to BL3 may extend in the second direction "y" and may be spaced apart from each other by a certain distance in the first direction "x".

Figure 4:
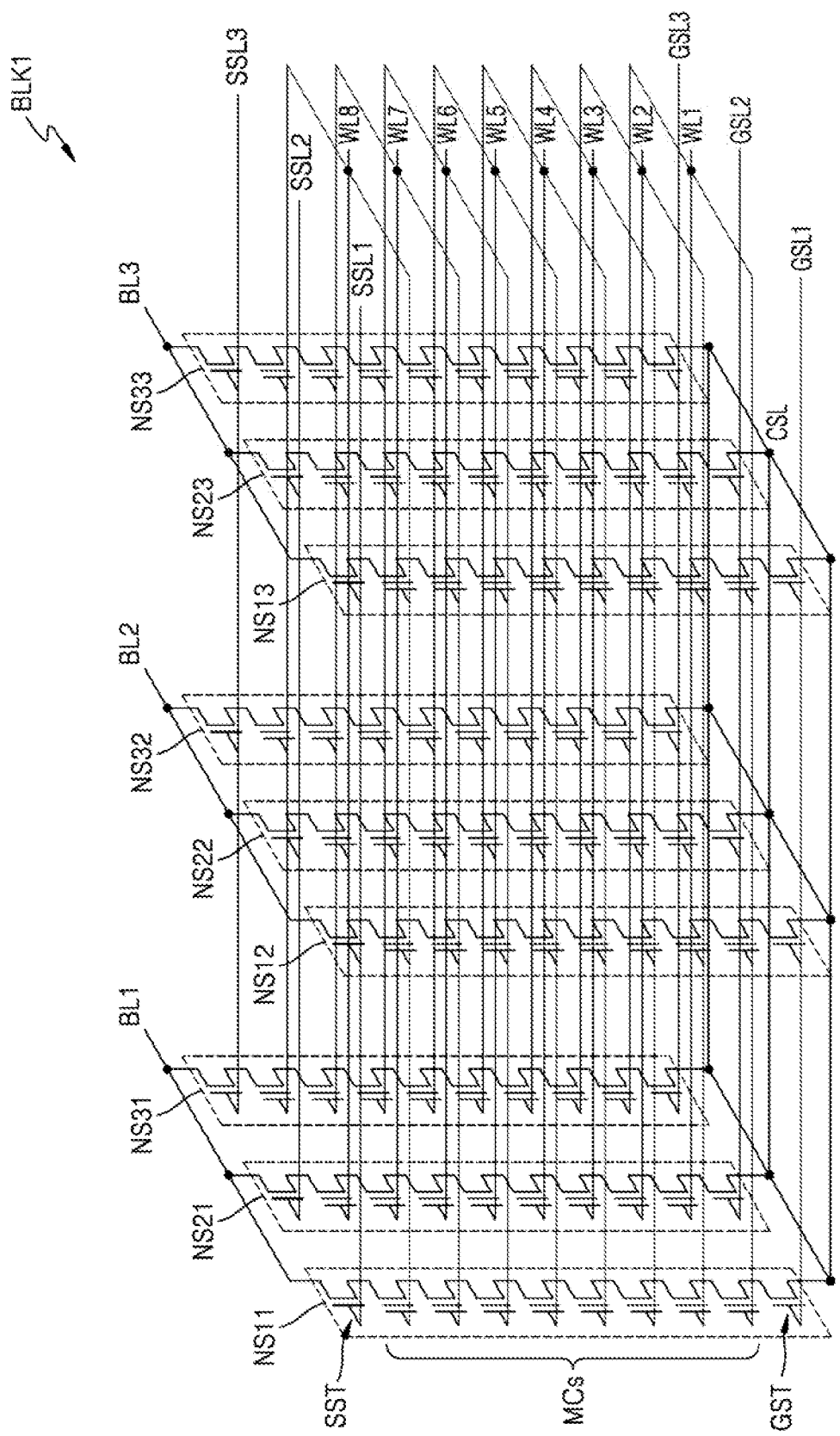
FIG. 4 is a circuit diagram of a memory block according to an example embodiment.

Referring to FIG. 4, the first memory block BLK1 may include vertical NAND flash memory.

The first memory block BLK1 may include NAND strings NS11 to NS33, first to eighth word lines WL1 to WL8, the first to third bit lines BL1 to BL3, ground select lines GSL1 to GSL3, string select lines SSL1 to SSL3, and the common source line CSL.

The numbers of NAND strings, word lines, bit lines, ground select lines, and string select lines may vary with embodiments.

The NAND strings NS11, NS21, and NS31 may be between the first bit line BL1 and the common source line CSL, the NAND strings NS12, NS22, and NS32 may be between the second bit line BL2 and the common source line CSL, and the NAND strings NS13, NS23, and NS33 may be between the third bit line BL3 and the common source line CSL. Each NAND string (e.g., NS11) may include a string select transistor SST, a plurality of memory cells MCs (e.g., the first memory cell to the eighth memory cell MC1 to MC8), and a ground select transistor GST, which are connected in series to one another.

The NAND strings NS11 to NS33 may have the same structure, and thus, the NAND string NS11 is mainly described below.

The NAND string NS11 may include the string select transistor SST, the memory cells MCs, and the ground select transistor GST, which are connected in series to one another. The string select transistor SST may be connected to a corresponding one of the first to third bit lines BL1 to BL3, and the ground select transistor GST may be connected to the common source line CSL. The string select transistor SST may be connected to a corresponding one of the string select lines SSL1 to SSL3. Each of the memory cells MCs may be connected to a corresponding one of the first to eighth word lines WL1 to WL8. The ground select transistor GST may be connected to a corresponding one of the ground select lines GSL1 to GSL3.

According to the number of data bits stored in each of the memory cells MCs, a single physical page may correspond to a plurality of logical pages. For example, when the memory cells MCs are single-level cells (SLCs), each of the first to eighth word lines WL1 to WL8 may correspond to a single page. When the memory cells MCs are MLCs, TLCs, or QLCs, each of the first to eighth word lines WL1 to WL8 may correspond to a plurality of pages. For example, when the memory cells MCs are MLCs, one physical page may correspond to three logical pages. The three logical pages may include a least significant bit (LSB) page, a central significant bit (CSB) page, and a most significant bit (MSB) page.

Although not shown, the NAND string NS11 may further include one or more dummy memory cells between the string select transistor SST and the memory cells MCs. The NAND string NS11 may further include one or more dummy memory cells between the ground select transistor GST and the memory cells MCs. The NAND string NS11 may further include one or more dummy memory cells among the memory cells MCs. Dummy memory cells may have the same structure as the memory cells MCs but may not be programmed or may be differently programmed than the memory cells MCs.

Referring to FIGS. 3 and 4, because the charge storage layer CS is formed along the exposed surfaces of the insulating layers IL, the pillars P, and the substrate SUB, all memory cells of a NAND string may share the charge storage layer CS with each other. Accordingly, lateral charge migration may occur so that charges move between adjacent memory cells.

By way of background, as lateral charge migration occurs, holes may be accumulated in the charge storage layer CS, and the accumulated holes may be recombined with electrons injected into the charge storage layer CS through a program operation. As a result, desired data may not be programmed.

Also by way of background, in the case where lateral charge migration occurs after the program operation, the threshold voltage of a memory cell may gradually decrease and, accordingly, data stored in the memory cell may be lost or the memory cell may be deep-erased. Therefore, a retention feature of the NVM device 140 may be degraded.

According to the present example embodiment, the NVM device 140 performs a correction operation on the threshold voltage of a deep-erased cell, thereby increasing the threshold voltage of the deep-erased cell The correction operation is described below with reference to FIGS. 5 to 8.

As a result of the correction operation, lateral charge migration may be reduced, and the retention feature of the NVM device 140 may be enhanced. Accordingly, a NVM device having increased reliability may be provided.

The correction operation for a deep-erased cell is described in detail below.

Figure 5:
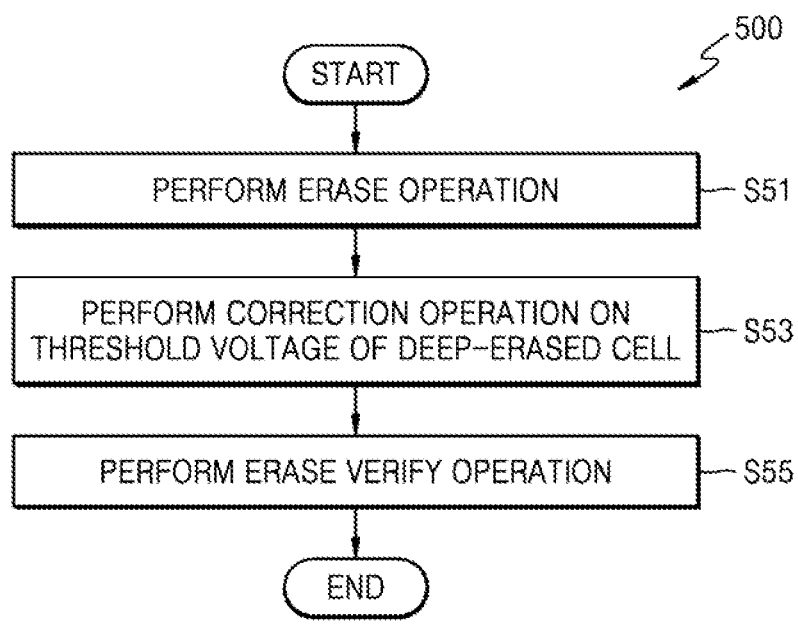
FIG. 5 is a flowchart of an operating method of a storage device, according to an example embodiment.

FIG. 5 is a flowchart 500 of an operating method of a storage device, according to an example embodiment. In detail, FIG. 5 is a diagram for describing a correction operation, which is performed on a deep-erased cell by the NVM device 140 in FIG. 1. FIGS. 1 to 4 are also referred to, in the description below.

Referring to FIG. 5, a correction operation for a deep-erased cell may include operations S51, S53, and S55.

The correction operation for a deep-erased cell may be performed in memory block units.

The NVM device 140 may perform an erase operation according to the erase command CMD of the controller 130 in operation S51. For example, when the NVM device 140 performs the erase operation, electrons trapped in the charge storage layer CS of the memory cells MCs of the first memory block BLK1 may be removed. Because of the recombination of electrons and holes accumulated through repetitive P/E cycles, a deep-erased cell having a threshold voltage decreased below a threshold value may occur.

The NVM device 140 may perform a correction operation on the threshold voltage of the deep-erased cell in operation S53. After the erase operation of the NVM device 140 is completed, the correction operation may be performed in memory block units. In detail, the NVM device 140 may apply a correction voltage Vco (in FIG. 11) to all memory cells MCs of all NAND strings NS11 to NS33 of the first memory block BLK1 in a state where the string select lines SSL1 to SSL3 and the ground select lines GSL1 to GSL3 are turned off. The level of the correction voltage Vco may be equal to the level of a program voltage Vpgm (in FIG. 9), which is applied to a memory cell during a program operation.

Electrons may be provided to the deep-erased cell among the memory cells of the first memory block BLK1 by performing the correction operation. A deep-erased cell has a greater channel potential between a word line and a channel than a normal memory cell. Accordingly, the holes accumulated in the charge storage layer CS may be recombined with the electrons supplied through the correction operation. In other words, the holes accumulated in the charge storage layer CS may be removed by supplying electrons to the charge storage layer CS.

At this time, because the correction operation is performed, electrons may be trapped in the deep-erased cell, and the amount of trapped charges may vary with deep-erased cells. Consequently, the NVM device 140 may increase the threshold voltage of the deep-erased cell to at least the threshold value through the correction operation.

The NVM device 140 may perform an erase verify operation in operation S55. The NVM device 140 may verify whether data in the memory cells, which have undergone the correction operation, is erased, by applying an erase verify voltage to the memory cells. When the threshold voltage of a memory cell is lower than or equal to the erase verify voltage, the NVM device 140 may determine that the data has normally been erased, and the correction operation may end. In an example embodiment, the NVM device 140 may repeat the erase operation including the correction operation such that the threshold voltage of a memory cell falls within a predefined range.

In an example embodiment, the NVM device 140 may periodically perform the correction operation, based on a performance degradation indicator thereof. The performance degradation indicator may include at least one selected from among an erase count of the NVM device 140, a programming loop count, the ratio between on-cells and off-cells after application of a one-shot program, and a write amplification factor (WAF).

Figure 6:
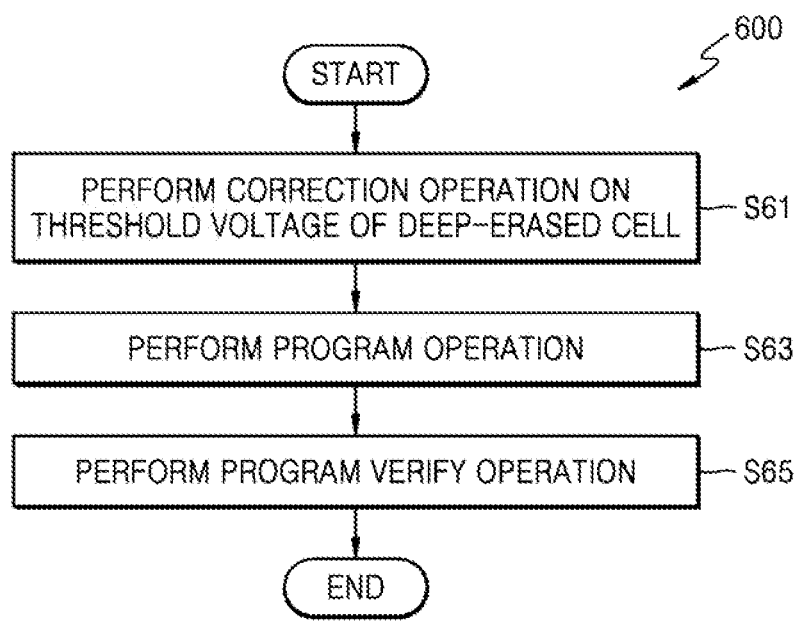
FIG. 6 is a flowchart of an operating method of a storage device, according to an example embodiment.

FIG. 6 is a flowchart 600 of an operating method of a storage device, according to an example embodiment. In detail, FIG. 6 is a diagram for describing a correction operation, which is performed on a deep-erased cell by the NVM device 140 in FIG. 1. FIGS. 1 to 4 are also referred to, in the description below.

Referring to FIG. 6, the correction operation for a deep-erased cell may include operations S61, S63, and S65.

The correction operation for a deep-erased cell may be performed in memory block units.

When the NVM device 140 repeatedly performs a P/E cycle, a deep-erased cell having a threshold voltage decreased below a threshold value may occur. To secure the retention performance of the NVM device 140, a correction operation may be performed on a deep-erased cell as an operation previous to a program operation.

The NVM device 140 may perform a correction operation on the threshold voltage of a deep-erased cell in operation S61. Before performing a program operation, the NVM device 140 may perform the correction operation in memory block units. In detail, the NVM device 140 may apply the correction voltage Vco to all memory cells MCs of all NAND strings NS11 to NS33 of the first memory block BLK1 in a state where the string select lines SSL1 to SSL3 and the ground select lines GSL1 to GSL3 are turned off. The level of the correction voltage Vco may be equal to the level of the program voltage Vpgm, which is applied to a memory cell during a program operation.

Electrons may be provided to the deep-erased cell among the memory cells of the first memory block BLK1 by performing the correction operation. A deep-erased cell has a greater channel potential between a word line and a channel than a normal memory cell. Accordingly, the holes accumulated in the charge storage layer CS may be recombined with the electrons supplied through the correction operation. In other words, the holes accumulated in the charge storage layer CS may be removed by supplying electrons to the charge storage layer CS.

At this time, because the correction operation is performed, electrons may be trapped in the deep-erased cell, and the amount of trapped charges may vary with deep-erased cells. Consequently, the NVM device 140 may increase the threshold voltage of the deep-erased cell to at least the threshold value through the correction operation.

The NVM device 140 may perform a program operation according to the program command CMD of the controller 130 in operation S63. For example, when the NVM device 140 performs the program operation, the program voltage Vpgm may be applied to the memory cells MCs included in a page corresponding to the first word line WL1 of the first memory block BLK1. In other words, electrons may be supplied to the charge storage layer CS of the memory cells MCs included in the page corresponding to the first word line WL1 of the first memory block BLK1.

The NVM device 140 may perform the program operation in memory page units.

The NVM device 140 may perform a program verify operation in operation S65. For example, the NVM device 140 may verify whether a memory cell has been normally programmed by applying a program verify voltage to the page corresponding to the first word line WL1 that has undergone the program operation. When the threshold voltage of a memory cell is higher than or equal to the program verify voltage, the NVM device 140 may determine that the memory cell has been normally programmed, and the correction operation may end.

In an example embodiment, while performing a program operation on a selected memory cell, the NVM device 140 may simultaneously perform a correction operation for a deep-erased cell by allowing a channel to float with respect to unselected memory cells and applying the correction voltage Vco to word lines.

In an example embodiment, the NVM device 140 may periodically perform the correction operation, based on the performance degradation indicator thereof. The performance degradation indicator may include at least one selected from among an erase count of the NVM device 140, a programming loop count, the ratio between on-cells and off-cells after application of a one-shot program, and a WAF.

Figure 7:
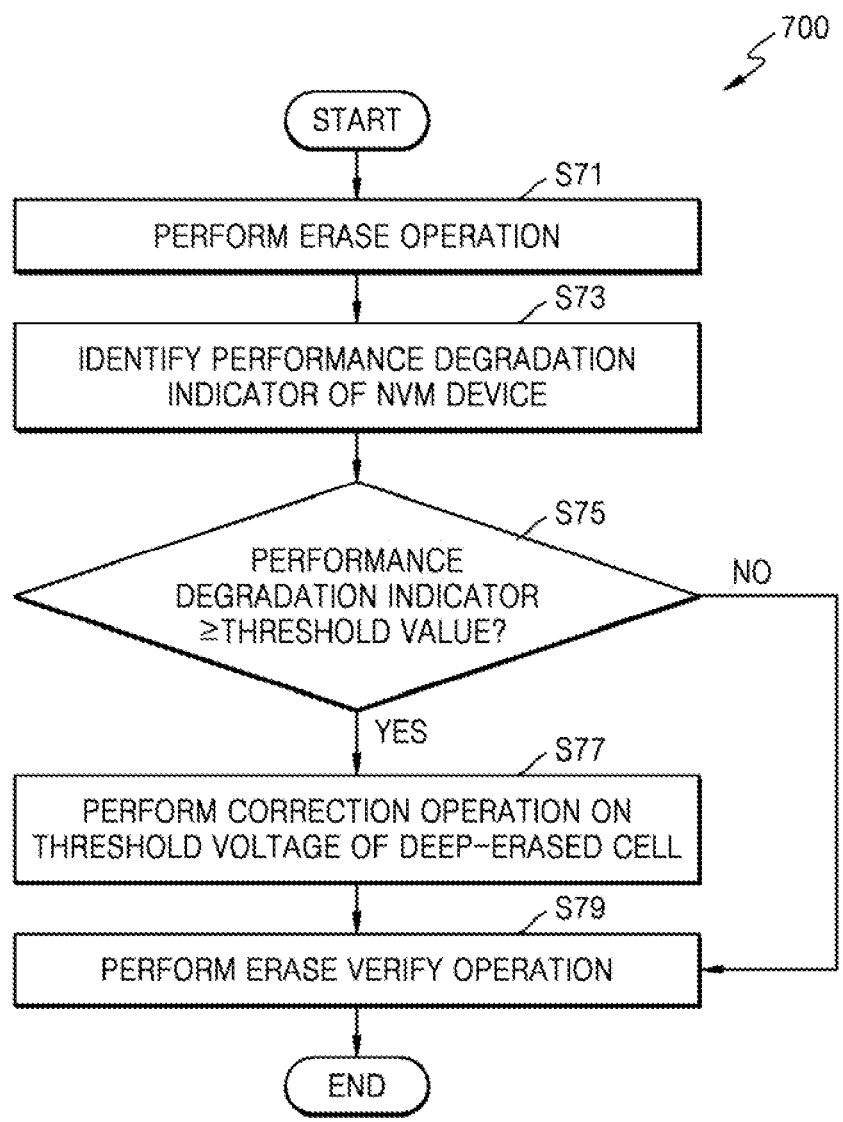
FIG. 7 is a flowchart of an operating method of a storage device, according to an example embodiment.

FIG. 7 is a flowchart 700 of an operating method of a storage device, according to an example embodiment. In detail, FIG. 7 is a diagram for describing a correction operation, which is performed on a deep-erased cell by the NVM device 140 in FIG. 1. FIGS. 1 to 4 are also referred to, in the description below.

Referring to FIG. 7, the correction operation for a deep-erased cell may include operations S71, S73, S75, S77, and S79.

The correction operation for a deep-erased cell may be performed in memory block units.

The NVM device 140 may perform an erase operation according to the erase command CMD of the controller 130 in operation S71. For example, when the NVM device 140 performs the erase operation, electrons trapped in the charge storage layer CS of the memory cells MCs of the first memory block BLK1 may be removed. During repetitive P/E cycles, a deep-erased cell having a threshold voltage decreased below a threshold value may occur.

The controller 130 may identify a performance degradation indicator of the NVM device 140 in operation S73. The performance degradation indicator of the NVM device 140 may include at least one selected from among an erase count of the NVM device 140, a programming loop count, the ratio between on-cells and off-cells after application of a one-shot program, and a WAF.

The controller 130 may determine whether the performance degradation indicator of the NVM device 140 is greater than or equal to a threshold value in operation S75. In other words, the controller 130 may determine whether the NVM device 140 satisfies a condition for correction, based on metadata stored in the metadata buffer MBF. For example, the controller 130 may determine whether the NVM device 140 satisfies a condition for correction, based on the erase count of each memory block, a programming loop count, or the like, which is stored in the metadata buffer MBF.

When the performance degradation indicator is greater than or equal to the threshold value, the NVM device 140 may perform operation S77.

When the performance degradation indicator is less than the threshold value, the NVM device 140 may perform operation S79.

The NVM device 140 may perform a correction operation on the threshold voltage of a deep-erased cell in operation S77. The NVM device 140 may perform a correction operation on the threshold voltage of a deep-erased cell by supplying electrons to the charge storage layer CS based on a channel potential between a word line and a channel. In detail, the NVM device 140 may apply the correction voltage Vco to all memory cells MCs of all NAND strings NS11 to NS33 of the first memory block BLK1 in a state where the string select lines SSL1 to SSL3 and the ground select lines GSL1 to GSL3 are turned off. The level of the correction voltage Vco may be equal to the level of the program voltage Vpgm, which is applied to a memory cell during a program operation.

The NVM device 140 may perform an erase verify operation in operation S79. The NVM device 140 may verify whether data in the memory cells, which have undergone the correction operation, is normally erased, by applying an erase verify voltage to the memory cells. When the threshold voltage of a memory cell is lower than or equal to the erase verify voltage, the NVM device 140 may determine that the data has normally been erased, and the correction operation may end.

In an example embodiment, the NVM device 140 may repeat the erase operation including the correction operation such that the threshold voltage of a memory cell falls within a predefined range, or may periodically perform the correction operation with a period determined based on a performance degradation indicator.

Figure 8:
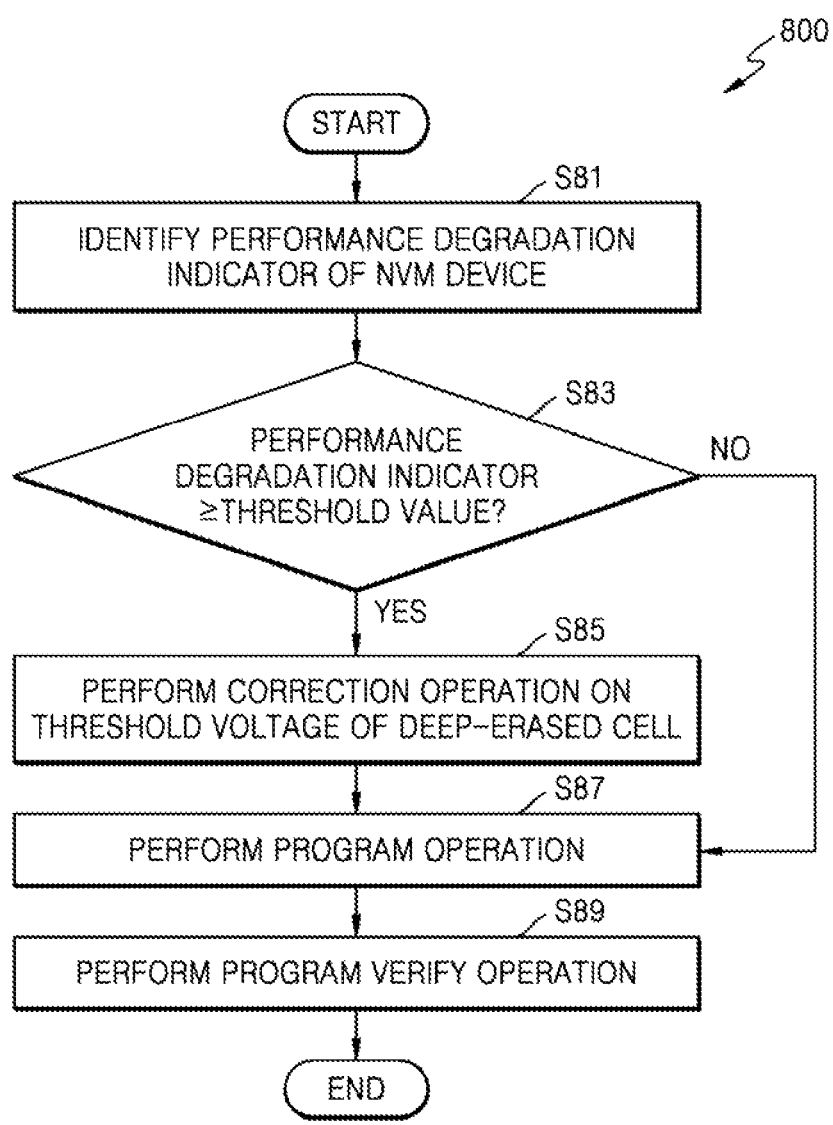
FIG. 8 is a flowchart of an operating method of a storage device, according to an example embodiment.

FIG. 8 is a flowchart 800 of an operating method of a storage device, according to an example embodiment. In detail, FIG. 8 is a diagram for describing a correction operation, which is performed on a deep-erased cell by the NVM device 140 in FIG. 1. FIGS. 1 to 4 are also referred to, in the description below.

Referring to FIG. 8, the correction operation for a deep-erased cell may include operations S81, S83, S85, S87, and S89.

The correction operation for a deep-erased cell may be performed in memory block units.

The controller 130 may identify a performance degradation indicator of the NVM device 140 in operation S81. The performance degradation indicator of the NVM device 140 may include at least one selected from among an erase count of the NVM device 140, a programming loop count, the ratio between on-cells and off-cells after application of a one-shot program, and a WAF.

The controller 130 may determine whether the performance degradation indicator of the NVM device 140 is greater than or equal to a threshold value in operation S83.

In other words, the controller 130 may determine whether the NVM device 140 satisfies a condition for correction, based on metadata stored in the metadata buffer MBF. For example, the controller 130 may determine whether the NVM device 140 satisfies a condition for correction, based on the erase count of each memory block, a programming loop count, or the like, which is stored in the metadata buffer MBF.

When the performance degradation indicator is greater than or equal to the threshold value, the NVM device 140 may perform operation S85.

When the performance degradation indicator is less than the threshold value, the NVM device 140 may perform operation S87.

The NVM device 140 may perform a correction operation on the threshold voltage of a deep-erased cell in operation S85. The NVM device 140 may perform the correction operation on the threshold voltage of a deep-erased cell by supplying electrons to the charge storage layer CS based on a channel potential between a word line and a channel. In detail, the NVM device 140 may apply the correction voltage Vco to all memory cells MCs of all NAND strings NS11 to NS33 of the first memory block BLK1 in a state where the string select lines SSL1 to SSL3 and the ground select lines GSL1 to GSL3 are turned off. The level of the correction voltage Vco may be equal to the level of the program voltage Vpgm, which is applied to a memory cell during a program operation.

The NVM device 140 may perform a program operation according to the program command CMD of the controller 130 in operation S87. For example, when the NVM device 140 performs the program operation, the program voltage Vpgm may be applied to the memory cells MCs included in a page corresponding to the first word line WL1 of the first memory block BLK1. In other words, electrons may be supplied to the charge storage layer CS of the memory cells MCs included in the page corresponding to the first word line WL1 of the first memory block BLK1.

The NVM device 140 may perform the program operation in memory page units.

The NVM device 140 may perform a program verify operation in operation S89. For example, the NVM device 140 may verify whether a memory cell has been normally programmed by applying a program verify voltage to the page corresponding to the first word line WL1 that has undergone the program operation. When the threshold voltage of a memory cell is higher than or equal to the program verify voltage, the NVM device 140 may determine that the memory cell has been normally programmed, and the correction operation may end.

In an example embodiment, the NVM device 140 may repeat the program operation including the correction operation such that the threshold voltage of a memory cell falls within a predefined range, or may periodically perform the correction operation with a period determined based on a performance degradation indicator.

In an example embodiment, while performing a program operation on a selected memory cell, the NVM device 140 may simultaneously perform a correction operation for a deep-erased cell by allowing a channel to float with respect to unselected memory cells and applying the correction voltage Vco to word lines. When a program operation and a correction operation are simultaneously performed, correction of a deep-erased cell may be efficiently performed without adding a separate configuration to the NVM device 140.

Figure 9:
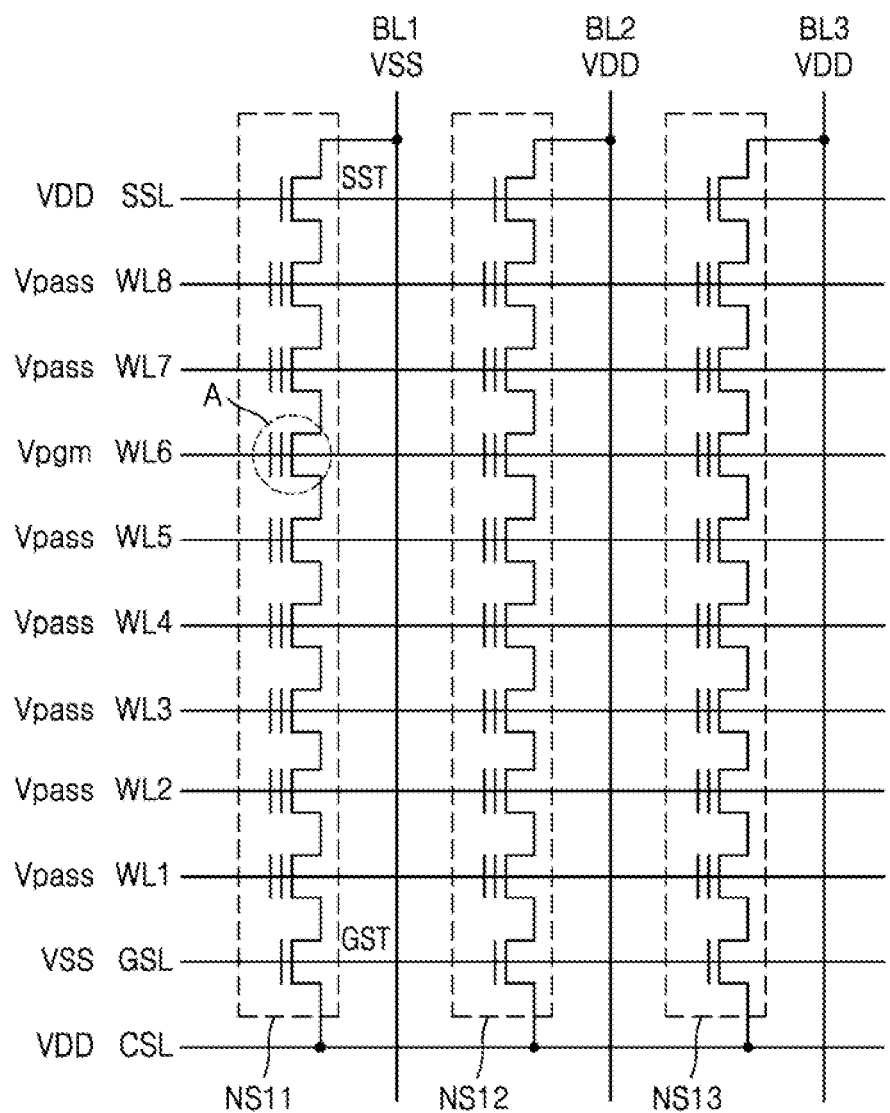
FIG. 9 is a diagram illustrating a program operation of a non-volatile memory device, according to an example embodiment.

FIG. 9 is a diagram illustrating a program operation of an NVM device, according to an example embodiment. FIG. 10 is a diagram illustrating an erase operation of an NVM device, according to an example embodiment. FIG. 11 is a diagram illustrating a correction operation of an NVM device, according to an example embodiment. In detail, FIGS. 9 to 11 are diagrams for describing operations of the NVM device 140 in FIGS. 1 to 4. FIGS. 1 to 8 are referred to for the description below.

Referring to FIG. 9, to perform a program operation, the NVM device 140 may apply a ground voltage VSS to a selected bit line (hereinafter, the first bit line BL1 is described as the selected bit line) and a power supply voltage VDD to unselected bit lines (hereinafter, the second and third bit lines BL2 and BL3 are described as the unselected bit lines). Simultaneously, the NVM device 140 may apply the program voltage Vpgm to a selected word line (hereinafter, the sixth word line WL6 is described as the selected word line) and a pass voltage Vpass to unselected word lines (e.g., the first to fifth words lines WL1 to WL5 and seventh and eighth word lines WL7 and WL8). The NVM device 140 may apply the program voltage Vpgm in word line units or physical page units.

Accordingly, a memory cell A at the intersection between the selected bit line, i.e., the first bit line BL1, and the selected word line, i.e., the sixth word line WL6, may be programmed. Electrons may be trapped and stored in the charge storage layer CS of the memory cell A. When the memory cell A is an MLC, the memory cell A may be programmed using incremental step pulse programming (ISPP), by which programming is performed by increasing the level of the program voltage Vpgm step by step, to accurately control the threshold voltage distribution of the memory cell A.

The level of the program voltage Vpgm may be higher than the level of the pass voltage Vpass. The levels of the program voltage Vpgm and the pass voltage Vpass may be higher than the level of the power supply voltage VDD. For example, the program voltage Vpgm may be 15 V, the pass voltage Vpass may be 10 V, and the power supply voltage VDD may be 3 V.

After performing the program operation, the NVM device 140 may perform an erase operation. By performing the erase operation, the NVM device 140 may be programmed afterward. The program operation and the erase operation may form a P/E cycle. The erase operation is described in detail with reference to FIG. 10 below.

Figure 10:
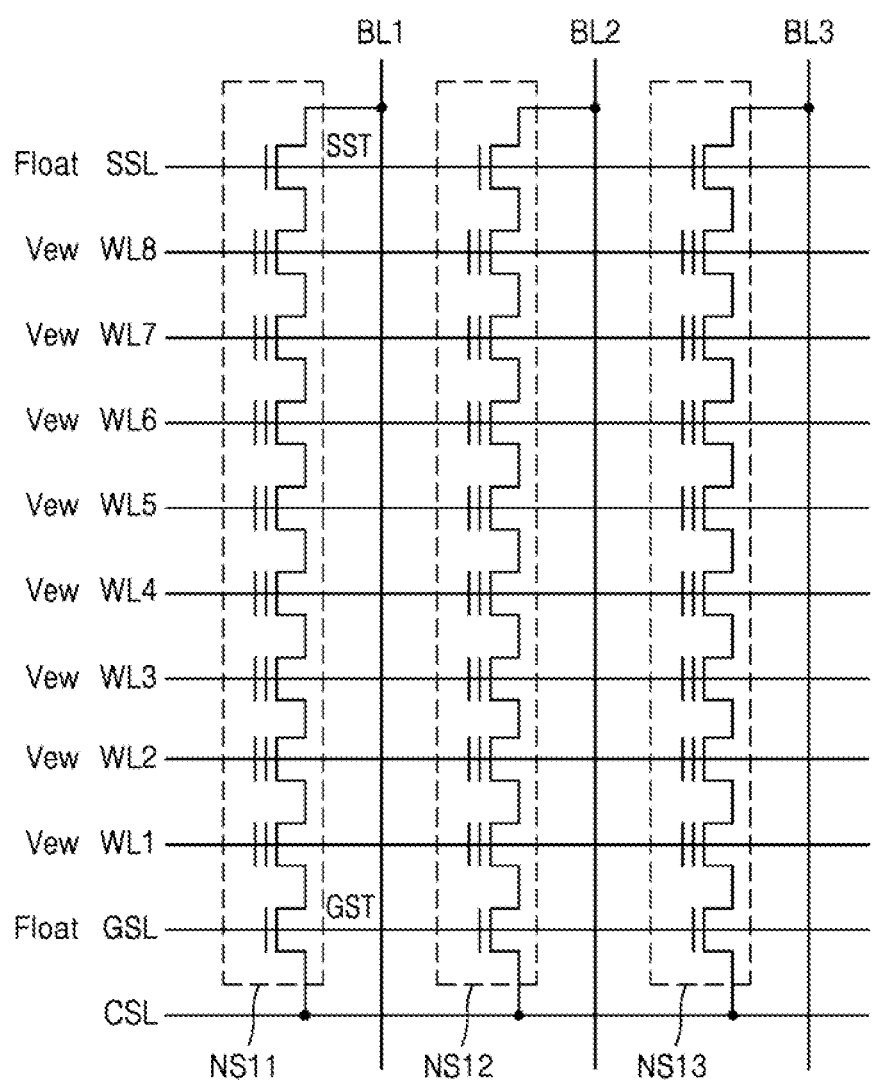
FIG. 10 is a diagram illustrating an erase operation of a non-volatile memory device, according to an example embodiment.

Referring to FIG. 10, to perform the erase operation, the NVM device 140 may allow all bit lines, i.e., the first to third bit lines BL1 to BL3, to float. Simultaneously, the NVM device 140 may apply an erase voltage to a bulk of each memory cell and a word line erase voltage Vew to all word lines, i.e., the first to eighth word lines WL1 to WL8.

The bulk may refer to a well region of each memory cell.

The erase voltage may be applied using incremental step pulse erasing (ISPE). The string select line SSL and the ground select line GSL may float. Accordingly, a voltage difference may occur between the surface layer S and the first to eighth word lines WL1 to WL8, and Fowler-Nordheim tunneling may occur in the memory cells MCs (e.g., the first to eighth words lines WL1 to WL8). Accordingly, the electrons trapped in the charge storage layer CS of the memory cell A may be erased.

The erase operation may be performed in memory block units.

The level of the erase voltage may be higher than the level of the word line erase voltage Vew. The level of the word line erase voltage Vew may be equal to the level of the ground voltage VSS. For example, the erase voltage may be 20 V, and the word line erase voltage Vew may be 0 V. The level of the erase voltage may be higher than the level of the program voltage Vpgm.

As the NVM device 140 repeatedly performs a P/E cycle, the NVM device 140 may satisfy the condition for correction, which has been described with reference to FIGS. 7 and 8 above. For example, the retention feature of the memory cells MCs of the NVM device 140 may have been degraded because holes have been accumulated in the charge storage layer CS of the memory cells MCs. To improve the degraded retention feature, correction operations may be repeatedly and consecutively performed.

The correction operation is described in detail with reference to FIG. 11.

Figure 11:
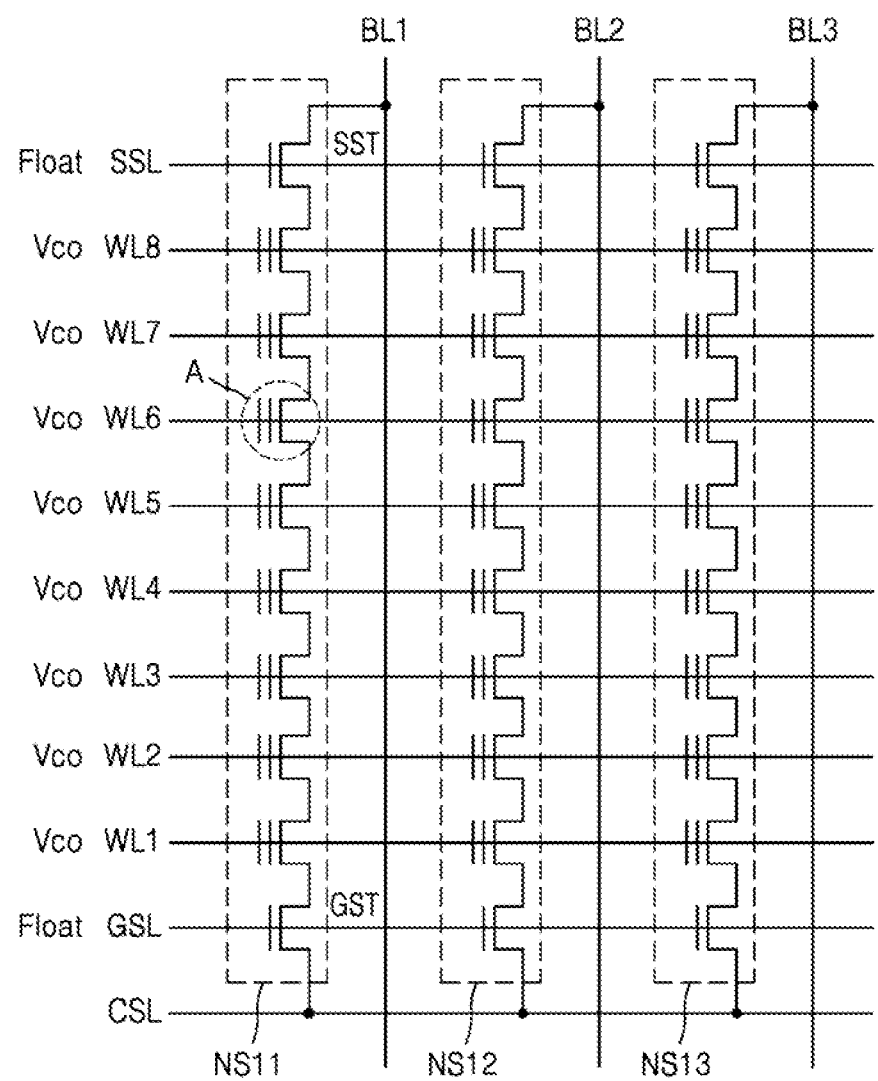
FIG. 11 is a diagram illustrating a correction operation for a deep-erased cell of a non-volatile memory device, according to an example embodiment.

Referring to FIG. 11, to perform a correction operation, the NVM device 140 may apply the ground voltage VSS to a selected bit line (hereinafter, the first bit line BL1 is described as the selected bit line) and the power supply voltage VDD to unselected bit lines (hereinafter, the second and third bit lines BL2 and BL3 are described as the unselected bit lines). Simultaneously, the NVM device 140 may apply the program voltage Vpgm to a selected word line (hereinafter, the sixth word line WL6 is described as the selected word line) and the correction voltage Vco to unselected word lines (e.g., the first to fifth words lines WL1 to WL5 and seventh and eighth word lines WL7 and WL8). Accordingly, a deep-erased cell among the other memory cells other than the memory cell A at the intersection between the first bit line BL1 and the sixth word line WL6 may be soft programmed. The correction operation for the deep-erased cell among the other memory cells other than the memory cell A may be performed simultaneously with a program operation or before or after a program or erase operation.

As the correction operation is performed, the deep-erased cell of a memory block may be soft programmed. In other words, electrons may be provided to the charge storage layer CS of the deep-erased cell and recombined with holes accumulated in the charge storage layer CS and thus erased. Because holes accumulated in a memory cell are removed by the correction operation, lateral charge migration may be improved, and the threshold voltage of a deep-erased cell may be increased. As a result, a retention feature may be enhanced.

Thereafter, a P/E cycle may be repeated. In an example embodiment, a correction operation for a deep-erased cell may be periodically performed as part of a P/E cycle. At this time, the period of the correction operation may be set based on the performance degradation indicator of memory cells.

In some example embodiments, a correction operation for a deep-erased cell may be selectively performed in a P/E cycle when the condition for correction (e.g., the performance degradation indicator of memory cells), which has been described above with reference to FIGS. 7 and 8, is satisfied. Accordingly, only when memory cells are degraded, a correction operation for a deep-erased cell may be selectively performed.

Figure 12:
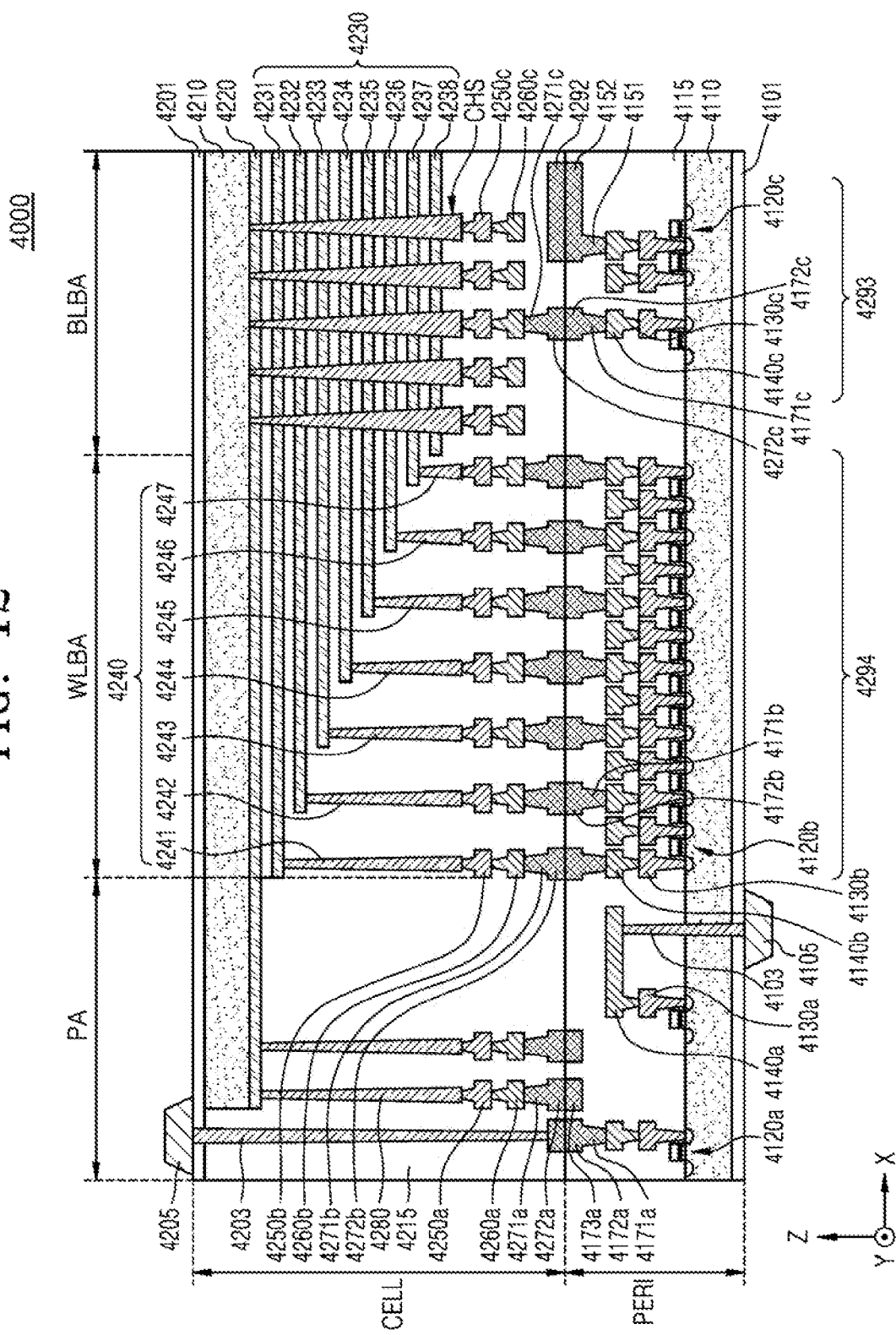
FIG. 12 is a cross-sectional view illustrating the structure of a non-volatile memory device, according to an example embodiment.

FIG. 12 is a cross-sectional view illustrating the structure of an NVM device, according to an example embodiment. In detail, FIG. 12 is a diagram for describing the structure of the NVM device 140 in FIGS. 1 and 2. FIGS. 1 and 2 are also referred to, in the description below.

Referring to FIG. 12, the NVM device 4000 may include a peripheral circuit region PERI and a cell region CELL. Each of the peripheral circuit region PERI and the cell region CELL may include an external pad bonding area PA, a word line bonding area WLBA, and a bit line bonding area BLBA.

The NVM device 4000 may have a chip-to-chip (C2C) structure. In the C2C structure, an upper chip including a cell region CELL may be formed on a first wafer, a lower chip including a peripheral circuit region PERI may be formed on a second wafer different from the first wafer, and the upper chip may be connected to the lower chip using a bonding method. For example, the bonding method may include a method of electrically connecting a bonding metal formed in a topmost metal layer of the upper chip to a bonding metal formed in a topmost metal layer of the lower chip. For example, when the bonding metal includes copper (Cu), the bonding method may include a Cu—Cu bonding method. In some embodiments, the bonding metal may include aluminum (Al) or tungsten (W).

The peripheral circuit region PERI may include a first substrate 4110, an interlayer insulating layer 4115, a plurality of circuit devices 4120a, 4120b, and 4120c formed in the first substrate 4110, first metal layers 4130a, 4130b, and 4130c respectively connected to the circuit devices 4120a, 4120b, and 4120c, and second metal layers 4140a, 4140b, and 4140c respectively formed on the first metal layers 4130a, 4130b, and 4130c. In an example embodiment, the first metal layers 4130a, 4130b, and 4130c may include tungsten having a relatively high resistivity, and the second metal layers 4140a, 4140b, and 4140c may include copper having a relatively low resistivity.

Only the first metal layers 4130a, 4130b, and 4130c and the second metal layers 4140a, 4140b, and 4140c are illustrated in FIG. 12, but, e.g., at least one metal layer may be further formed on the second metal layers 4140a, 4140b, and 4140c. At least a portion of the at least one metal layer on the second metal layers 4140a, 4140b, and 4140c may include aluminum, which has a lower electrical resistivity than copper included in the second metal layers 4140a, 4140b, and 4140c.

The interlayer insulating layer 4115 may be arranged on the first substrate 4110 to cover the circuit devices 4120a, 4120b, and 4120c, the first metal layers 4130a, 4130b, and 4130c, and the second metal layers 4140a, 4140b, and 4140c and may include an insulating material such as silicon oxide or silicon nitride.

Lower bonding metals 4171b and 4172b may be formed on the second metal layer 4140b in the word line bonding area WLBA. In the word line bonding area WLBA, the lower bonding metals 4171b and 4172b of the peripheral circuit region PERI may be electrically connected to upper bonding metals 4271b and 4272b of the cell region CELL using a bonding method. The lower bonding metals 4171b and 4172b and the upper bonding metals 4271b and 4272b may include aluminum, copper, or tungsten.

The cell region CELL may provide at least one memory block. The cell region CELL may include a second substrate 4210 and a common source line 4220. Word lines 4231 to 4238 (collectively denoted by 4230) may be stacked on the second substrate 4210 in a direction (i.e., a Z-axis direction) perpendicular to a top surface of the second substrate 4210. String select lines may be arranged above the word lines 4230 and a ground select line may be arranged below the word lines 4230. The word lines 4230 may be arranged between the string select lines and the ground select line.

In the bit line bonding area BLBA, a channel structure CHS may extend in the direction (the Z-axis direction) perpendicular to the top surface of the second substrate 4210 and pass through the word lines 4230, the string select lines, and the ground select line. The channel structure CH may include a data storage layer, a channel layer, and a buried insulating layer. The channel layer may be electrically connected to a first metal layer 4250c and a second metal layer 4260c. For example, the first metal layer 4250c may correspond to a bit line contact, and the second metal layer 4260c may correspond to a bit line and may be referred to as a bit line 4260c below. The bit line 4260c may extend in a direction (i.e., a Y-axis direction) parallel with the top surface of the second substrate 4210.

An area, in which the channel structure CHS and the bit line 4260c are arranged, may be defined as the bit line bonding area BLBA. The bit line 4260c may be electrically connected to circuit devices 4120c, which form a page buffer 4293. For example, the bit line 4260c may be connected to upper bonding metals 4271c and 4272c in the bit line bonding area BLBA, and the upper bonding metals 4271c and 4272c may be connected to lower bonding metals 4171c and 4172c connected to the circuit devices 4120c of the page buffer 4293. The page buffer 4293 may correspond to the page buffer 144 in FIG. 2.

In the word line bonding area WLBA, the word lines 4230 may be perpendicular to a first direction (e.g., the Y-axis direction) and extend in a second direction (e.g., an X-axis direction) parallel with the top surface of the second substrate 4210 and may be connected to a plurality of cell contact plugs 4241 to 4247 (collectively denoted by 4240). The word lines 4230 may be connected to the cell contact plugs 4240 through pads, which are provided by at least some of the word lines 4230 extending in different lengths in the second direction (e.g., an X-axis direction). A first metal layer 4250b and a second metal layer 4260b may be sequentially stacked on each of the cell contact plugs 4240 connected to the word lines 4230. The cell contact plugs 4240 in the word line bonding area WLBA may be connected to the peripheral circuit region PERI through the upper bonding metals 4271b and 4272b of the cell region CELL and the lower bonding metals 4171b and 4172b of the peripheral circuit region PERI.

The cell contact plugs 4240 may be electrically connected to circuit devices 4120b, which form a row decoder 4294. The operating voltage of the circuit devices 4120b may be different from the operating voltage of the circuit devices 4120c forming the page buffer 4293. For example, the operating voltage of the circuit devices 4120b may be less than the operating voltage of the circuit devices 4120c. The row decoder 4294 may correspond to the row decoder 142 in FIG. 2.

A common source line contact plug 4280 may be arranged in the external pad bonding area PA. The common source line contact plug 4280 may include a conductive material (e.g., metal, a metal compound, or polysilicon) and may be electrically connected to the common source line 4220. A first metal layer 4250a and a second metal layer 4260a may be sequentially stacked on the common source line contact plug 4280. An area, in which the common source line contact plug 4280, the first metal layer 4250a, and the second metal layer 4260a are arranged, may be defined as the external pad bonding area PA.

The external pad bonding area PA may include first and second I/O pads 4105 and 4205. A lower insulating film 4101 covering the bottom surface of the first substrate 4110 may be formed below the first substrate 4110, and the first I/O pad 4105 may be formed on the lower insulating film 4101. The first I/O pad 4105 may be connected to at least one of the circuit devices 4120a, 4120b, and 4120c of the peripheral circuit region PERI through a first I/O contact plug 4103 and may be isolated from the first substrate 4110 by the lower insulating film 4101. A side insulating film may be arranged between the first I/O contact plug 4103 and the first substrate 4110 to electrically isolate the first I/O contact plug 4103 from the first substrate 4110.

An upper insulating film 4201 covering a top surface of the second substrate 4210 may be formed above the second substrate 4210, and the second I/O pad 4205 may be arranged on the upper insulating film 4201. The second I/O pad 4205 may be connected to at least one of the circuit devices 4120a, 4120b, and 4120c of the peripheral circuit region PERI through a second I/O contact plug 4203. In an example embodiment, the second I/O pad 4205 may be electrically connected to the circuit device 4120a.

The second substrate 4210 and the common source line 4220 may not be arranged in an area, in which the second I/O contact plug 4203 is arranged. The second I/O pad 4205 may not overlap the word lines 4230 in a third direction (e.g. the Z-axis direction). The second I/O contact plug 4203 may be separated from the second substrate 4210 in the direction parallel with the top surface of the second substrate 4210 and may pass through an interlayer insulating layer 4215 of the cell region CELL to be connected to the second I/O pad 4205.

According to example embodiments, the first I/O pad 4105 and the second I/O pad 4205 may be selectively formed. For example, the NVM device 4000 may include only the first I/O pad 4105 on the first substrate 4110 or only the second I/O pad 4205 on the second substrate 4210. Alternatively, the NVM device 4000 may include both the first I/O pad 4105 and the second I/O pad 4205.

A metal pattern of a topmost metal layer may be provided as a dummy pattern in the external pad bonding area PA of each of the cell region CELL and the peripheral circuit region PERI, or the topmost metal layer may be empty.

In correspondence to an upper metal pattern 4272a in the topmost metal layer of the cell region CELL, a lower metal pattern 4173a having the same shape as the upper metal pattern 4272a may be formed, by the NVM device 4000, in a topmost metal layer of the peripheral circuit region PERI in the external pad bonding area PA. The lower metal pattern 4173a in the topmost metal layer of the peripheral circuit region PERI may not be connected to a separate contact in the peripheral circuit region PERI. Similarly, in correspondence to the lower metal pattern 4173a in the topmost metal layer of the peripheral circuit region PERI in the external pad bonding area PA, the upper metal pattern 4272a having the same shape as the lower metal pattern 4173a of the peripheral circuit region PERI may be formed in the topmost metal layer of the cell region CELL.

The lower bonding metals 4171b and 4172b may be formed on the second metal layer 4140b in the word line bonding area WLBA. In the word line bonding area WLBA, the lower bonding metals 4171b and 4172b of the peripheral circuit region PERI may be electrically connected to the upper bonding metals 4271b and 4272b of the cell region CELL using a bonding method.

In correspondence to a lower metal pattern 4152 formed in the topmost metal layer of the peripheral circuit region PERI, in the bit line bonding area BLBA, an upper metal pattern 4292 having the same shape as the lower metal pattern 4152 may be formed on the topmost metal layer of the cell region CELL. A contact may not be formed on the upper metal pattern 4292 in the topmost metal layer of the cell region CELL.

Figure 13:
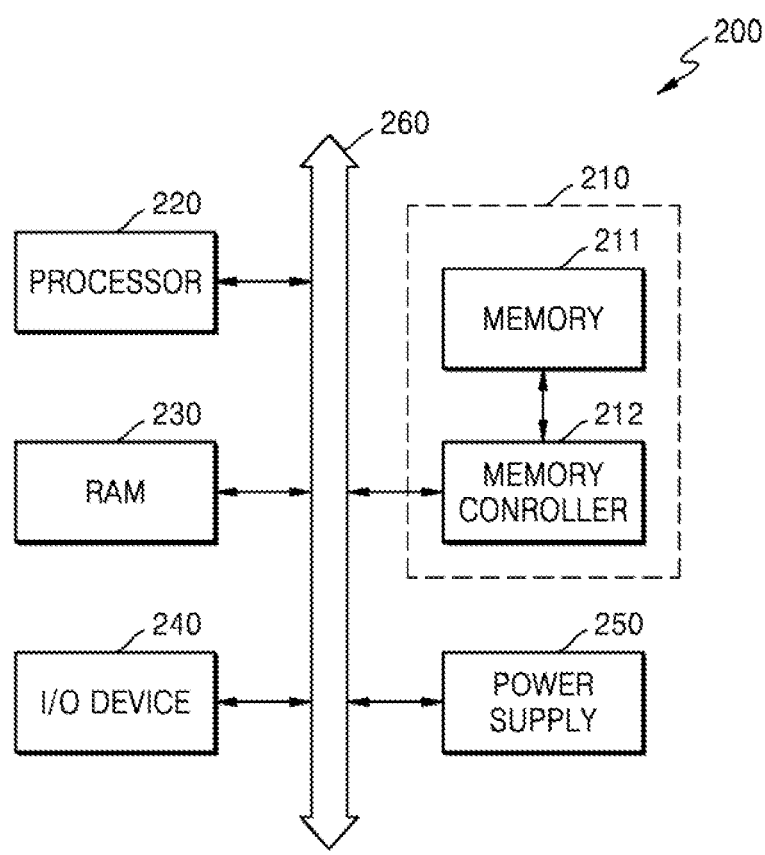
FIG. 13 is a block diagram of a computing system according to an example embodiment.

FIG. 13 is a block diagram of a computing system according to an example embodiment.

Referring to FIG. 13, a computing system 200 may include a memory system 210, a processor 220, RAM 230, an I/O device 240, and a power supply 250.

Although not shown in FIG. 11, the computing system 200 may further include ports, which may communicate with a video card, a sound card, a memory card, or a USB device or may communicate with other electronic devices.

The computing system 200 may be or include a PC or a portable electronic device, such as a notebook computer, a cellular phone, a PDA, or a camera.

The processor 220 may perform particular calculations or tasks. According to an example embodiment, the processor 220 may include a microprocessor or a CPU.

The processor 220 may communicate with the RAM 230, the I/O device 240, and the memory system 210 through a bus 260, such as an address bus, a control bus, or a data bus. According to an example embodiment, the processor 220 may also be connected to an expansion bus such as a PCI bus.

The memory system 210 may communicate with the processor 220, the RAM 230, and the I/O device 240 through the bus 260.

At the request of the processor 220, the memory system 210 may store received data or provide data stored therein to the processor 220, the RAM 230, or the I/O device 240.

The memory system 210 may correspond to the memory system 100 of FIG. 1. The memory system 210 may include a memory 211 and a memory controller 212. The memory 211 may correspond to the NVM device 140 that has been described with reference to FIGS. 2 to 11. The memory system 210 may include the NVM device 140 that has been described with reference to FIGS. 2 to 11.

The memory 211 may operate according to the operating methods described above with reference to FIGS. 5 to 11, based on the control of the memory controller 212. For example, the memory 211 may periodically and repeatedly perform correction operations in a P/E cycle. In another implementation, the memory 211 may selectively perform a correction operation for a deep-erased cell only when a condition for correction is satisfied. A plurality of correction operations may be consecutively performed. The memory controller 212 may determine whether a condition for correction is satisfied and may control a correction operation based on a determination result. As the memory 211 performs a correction operation, the threshold voltage of a deep-erased cell caused by lateral charge migration may be improved, and the memory system 210 having increased reliability may be provided.

The RAM 230 may store data necessary for the operation of the computing system 200. For example, the RAM 230 may include DRAM, SRAM, PRAM, ferroelectric RAM (FRAM), RRAM, and/or MRAM.

The I/O device 240 may include an input unit, such as a keyboard, a keypad, or a mouse, and an output unit, such as a printer or a display.

The power supply 250 may provide an operating voltage necessary for the operation of the computing system 200.

Figure 14:
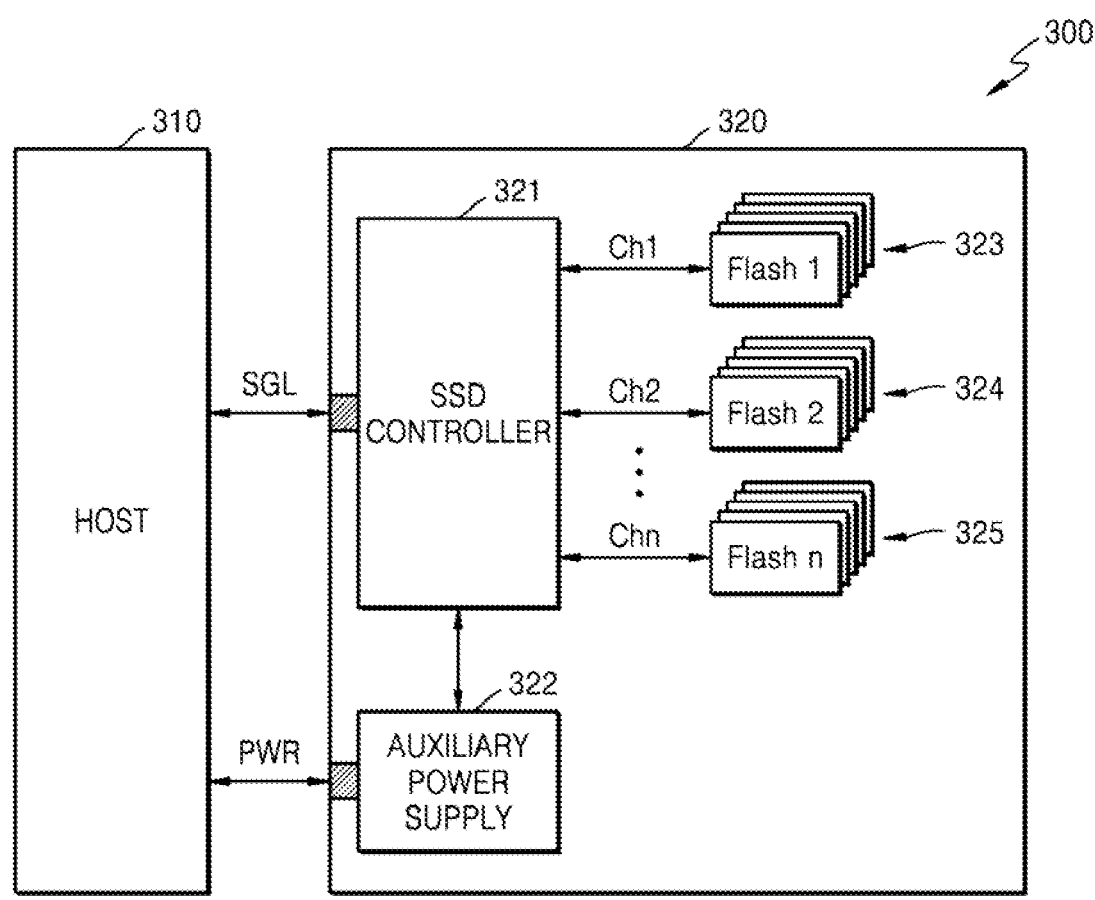
FIG. 14 is a block diagram of a solid-state drive (SSD) system according to an example embodiment.

FIG. 14 is a block diagram of an SSD system according to an example embodiment.

Referring to FIG. 14, an SSD system 300 includes a host 310 and an SSD 320.

The SSD 320 may exchange signals SGL with the host 310 through a signal connector, and may receive power PWR through a power connector.

The SSD 320 may include an SSD controller 321, an auxiliary power supply 322, and a plurality of memory devices 323, 324, and 325.

The memory devices 323, 324, and 325 may include vertical NAND flash memory devices. At least one of the memory devices 323, 324, and 325 may include the NVM device 140 described with reference to FIGS. 2 to 4. In other words, at least one of the memory devices 323, 324, and 325 may perform a correction operation for a deep-erased cell based on the control of the SSD controller 321, by using the operating methods according to embodiments described with reference to FIGS. 5 to 11. Accordingly, the retention feature of the memory device, which performs the correction operation for a deep-erased cell among the memory devices 323, 324, and 325, may be improved, and the SSD system 300 having increased reliability may be provided.

By way of summation and review, as the integration density of NAND flash memory devices increases, the reliability thereof may decrease. Among indicators of the reliability of NAND flash memory devices, a retention feature is an important indicator that indicates how long NAND flash memory devices can retain data without loss after storing the data. Therefore, a semiconductor device having an improved retention feature is desired.

As described above, embodiments relate to a semiconductor device and an operating method thereof, and more particularly, to a semiconductor device performing correction of the threshold voltage of a deep-erased cell and an operating method of the semiconductor device.

Embodiments may provide a semiconductor device for improving a retention feature by performing correction of the threshold voltage of a deep-erased cell.

Embodiments may provide an operating method of a semiconductor device improving a retention feature by performing correction of the threshold voltage of a deep-erased cell.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A non-volatile memory device, comprising:
   a memory including a plurality of blocks; and
   a controller configured to perform an erase operation on at least one block of the memory, perform a correction operation on a threshold voltage of a deep-erased cell among a plurality of cells of the at least one block, and perform an erase verify operation by identifying whether threshold voltages of the plurality of cells fall within a predefined range,
   wherein the controller is further configured to, in the correction operation, turn off a string select line and a ground select line of the at least one block and apply a correction voltage to word lines of the at least one block.

2. The non-volatile memory device of claim 1, wherein a level of the correction voltage is equal to a level of a program voltage, the program voltage being applied to a selected word line of the at least one block when the at least one block performs a program operation.

3. The non-volatile memory device of claim 1, wherein the controller is further configured to, when the threshold voltages of the plurality of cells do not fall within the predefined range in the erase verify operation, repeatedly perform the correction operation on the at least one block until the threshold voltages of the plurality of cells fall within the predefined range.

4. The non-volatile memory device of claim 1, wherein the controller is further configured to determine a period, in which the correction operation is performed, based on a performance degradation indicator of the at least one block and periodically perform the correction operation on the threshold voltage of the deep-erased cell with the determined period.

5. The non-volatile memory device of claim 4, wherein a performance degradation indicator of the memory includes at least one of an erase count of the at least one block, a programming loop count, a ratio between on-cells and off-cells after application of a one-shot program, and a write amplification factor (WAF).

6. The non-volatile memory device of claim 1, wherein the controller is further configured to perform the correction operation in block units in the non-volatile memory device.

7. A semiconductor device, comprising:
a memory device; and
a controller configured to perform a correction operation on a threshold voltage of a deep-erased cell as an operation previous to a program operation, perform the program operation on a plurality of cells of the memory device that has undergone the correction operation, and perform a program verify operation by identifying whether threshold voltages of the plurality of cells fall within a predefined range,
wherein the controller is further configured to, in the correction operation, turn off a string select line and a ground select line of the memory device and apply a correction voltage to the memory device.

8. The semiconductor device of claim 7, wherein the correction voltage is used to soft program the deep-erased cell and has a level equal to a level of a program voltage applied to word lines of the memory device during the program operation of the memory device.

9. The semiconductor device of claim 7, wherein the controller is further configured to, when the threshold voltages of the plurality of cells of the memory device do not fall within the predefined range in the program verify operation, repeatedly perform the correction operation on the memory device until the threshold voltages of the plurality of cells fall within the predefined range.

10. The semiconductor device of claim 7, wherein the controller is further configured to determine a period, in which the correction operation is performed, based on a performance degradation indicator of the memory device and periodically perform the correction operation on the threshold voltage of the deep-erased cell with the determined period.

11. The semiconductor device of claim 10, wherein the performance degradation indicator of the memory device includes at least one of an erase count of the memory device, a programming loop count, a ratio between on-cells and off-cells after application of a one-shot program, and a write amplification factor (WAF).

12. The semiconductor device of claim 7, wherein the controller is further configured to perform the correction operation in block units in the memory device.

13. An operating method of a semiconductor device including a memory device, the operating method comprising:
performing an erase operation on the memory device;
identifying a performance degradation indicator of the memory device; and
performing a correction operation on a threshold voltage of a deep-erased cell when the performance degradation indicator is greater than or equal to a threshold value,
wherein the performing of the correction operation includes:
turning off a string select line and a ground select line of the memory device, and
applying a correction voltage to the memory device, and
wherein the correction operation is performed in block units in the memory device.

14. The operating method of claim 13, wherein the correction voltage is used to soft program the deep-erased cell and has a level equal to a level of a program voltage applied to a selected word line of the memory device during a program operation of the memory device.

15. The operating method of claim 13, wherein the performance degradation indicator of the memory device includes at least one of an erase count of the memory device, a programming loop count, a ratio between on-cells and off-cells after application of a one-shot program, and a write amplification factor (WAF).

16. The operating method of claim 13, further comprising:
performing an erase verify operation by identifying whether threshold voltages of a plurality of cells of the memory device fall within a predefined range; and
when the threshold voltages of the plurality of cells of the memory device do not fall within the predefined range, repeatedly performing the correction operation on the memory device until the threshold voltages of the plurality of cells of the memory device fall within the predefined range.

17. The operating method of claim 13, further comprising:
determining a period, in which the correction operation is performed, based on the performance degradation indicator of the memory device; and
periodically performing the correction operation on the threshold voltage of the deep-erased cell with the determined period.

* * * * *